United States Patent [19]

Okazaki et al.

[11] Patent Number: 5,126,164
[45] Date of Patent: Jun. 30, 1992

[54] METHOD OF FORMING A THIN POLYMERIC FILM BY PLASMA REACTION UNDER ATMOSPHERIC PRESSURE

[75] Inventors: Satiko Okazaki, Tokyo; Masuhiro Kogoma, Saitama, both of Japan

[73] Assignee: Research Development Corporation of Japan, Tokyo, Japan

[21] Appl. No.: 522,462

[22] Filed: May 14, 1990

Related U.S. Application Data

[63] Continuation-in-part of Ser. No. 361,861, Jun. 6, 1989, abandoned.

[30] Foreign Application Priority Data

| Jun. 6, 1988 | [JP] | Japan | 63-138630 |
| Jul. 4, 1988 | [JP] | Japan | 63-166599 |
| Aug. 15, 1988 | [JP] | Japan | 63-202977 |

[51] Int. Cl.$^5$ ........................ B05D 3/06; C23C 16/00
[52] U.S. Cl. ........................ 427/39; 427/38; 427/255.6; 427/255.1
[58] Field of Search ........ 427/39, 38, 37, 255.6, 427/255, 255.1, 255.2; 118/723, 722; 156/643

[56] References Cited

U.S. PATENT DOCUMENTS

| 4,223,048 | 9/1980 | Engle | 118/723 |
| 4,292,384 | 9/1981 | Straughan et al. | 430/5 |
| 4,532,022 | 7/1985 | Takasaki et al. | 204/192 D |
| 4,616,597 | 10/1986 | Kaganowicz | 118/723 |
| 4,834,020 | 5/1989 | Bartholomew et al. | 118/719 |

FOREIGN PATENT DOCUMENTS

| 58-175824 | 10/1983 | Japan . | |
| 59-211219 | 11/1984 | Japan | 118/723 |
| 60-258914 | 12/1985 | Japan | 118/723 |
| 63-310795 | 12/1988 | Japan . | |

Primary Examiner—Michael Lusignan
Assistant Examiner—Roy V. King
Attorney, Agent, or Firm—Wenderoth, Lind & Ponack

[57] ABSTRACT

A process for forming a thin polymeric film is disclosed, which comprises introducing a mixture of an organic monomer gas and helium into a reaction vessel, producing a glow discharge plasma at atmospheric pressure and depositing the plasma on a substrate wherein the helium in the gas mixture is present in an amount higher than 90% by volume.

1 Claim, 5 Drawing Sheets

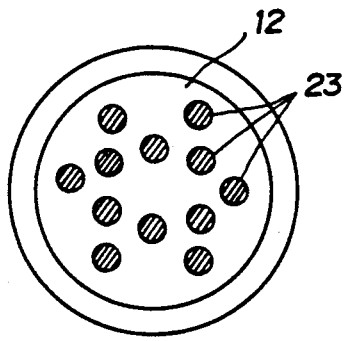
FIG. 3
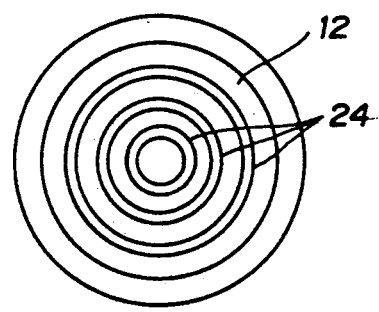
FIG. 4
FIG. 5
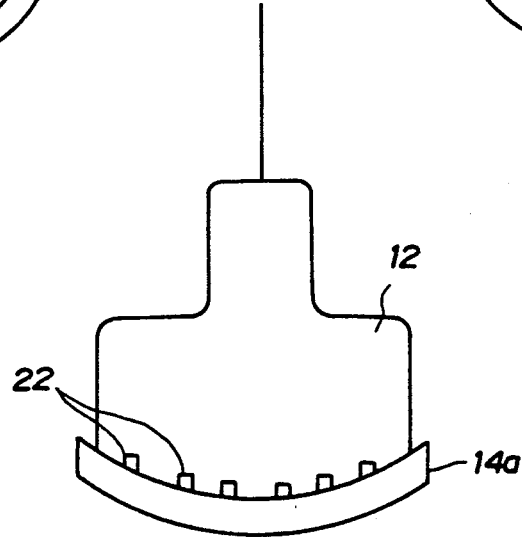
FIG. 6
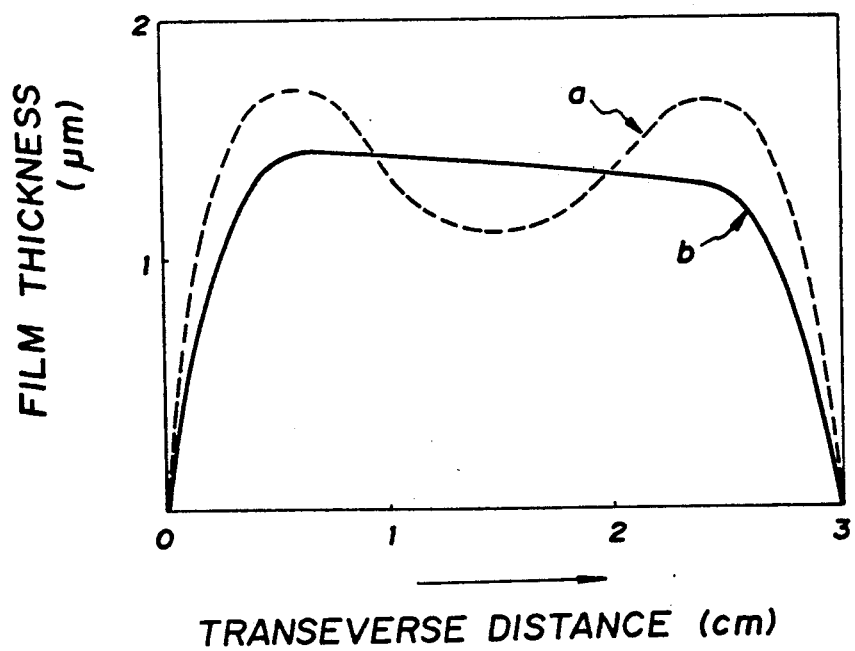

METHOD OF FORMING A THIN POLYMERIC FILM BY PLASMA REACTION UNDER ATMOSPHERIC PRESSURE

This application is a continuation-in-part of application, Ser. No. 07/361,861 filed on Jun. 6, 1989, now abandoned.

FIELD OF THE INVENTION

The present invention relates to a method and apparatus for causing plasma reaction under atmospheric pressure. More particularly, the present invention relates to a method and apparatus for forming a thin film at a high efficiency and/or for reforming the surface by means of a highly stable glow discharge plasma under atmospheric pressure.

BACKGROUND OF THE INVENTION

The film forming method and the surface reforming method based on low-pressure glow discharge plasma are widely known and industrially applied in various areas. It is also known that one of the surface treatment methods with low-pressure glow discharge plasma is that known as the organic plasma reaction method for forming a thin film and/or reforming the surface by means of the conversion an organic compound gas into plasma.

There are available, for example, a method of plasma-exciting a hydrocarbon gas in a vacuum vessel and forming by precipitation an amorphous carbon film on a silicon substrate or a glass substrate, and a method for forming a plasma polymer film of an unsaturated hydrocarbon such as ethylene.

However, all these conventional surface treatment methods based on low-pressure glow discharge plasma require an apparatus and facilities for creating low-pressure conditions because the reaction is to take place under a vacuum of about $1 \times 10^{-5}$ to $1 \times 10^{-3}$ torr in all cases, thus resulting in complicated operations and maintenance and a high manufacturing cost. A low-pressure method has another defect of a difficult treatment of a large-area substrate.

With a view to overcoming these defects in the conventional methods, the present inventor carried out extensive studies and completed a new film forming method based on glow discharge plasma under atmospheric pressure permitting reduction of costs for apparatus and facilities and easy film formation on a large-area substrate. The backdrop for this development included inventor's research on ozone producing silent discharge for many years and analysis of the reaction mechanism regarding plasma film formation.

The reaction caused by glow discharge under atmospheric pressure has been studied by the present inventor as a reaction of a fluorine-containing gas, and the present invention was a perfection of his study into a film forming method and further a surface reforming method.

Furthermore, the present invention provides a solution also to the weak point of glow discharge plasma reaction under atmospheric pressure of an easily producing arc discharge when the substrate is a conductive metal or alloy.

More specifically, the present invention provides an improved reaction method based on glow-discharge plasma under the atmospheric pressure which makes available, even with a metal or alloy substrate, a highly stable plasma of a reaction gas with a high reaction activity under atmospheric pressure.

OBJECT OF THE INVENTION

The present invention was developed in view of the above-mentioned circumstances, and has an object to provide a method and an apparatus for forming a film based on glow discharge under atmospheric pressure, which solves the defects in the conventional film forming method based on low-pressure glow discharge plasma, reduces costs for apparatus and facilities, and permits easy formation of a thin film onto a large-area substrate.

Another object of the present invention is to provide an improved treating method based on a high-activity and high-stability glow discharge plasma under the atmospheric pressure, which is free from arc discharge even with a substrate of a conductive material such as a metal or an alloy.

BRIEF DESCRIPTION OF THE DRAWINGS

FIGS. 3 and 4 are bottom views illustrating a typical lower surface of the upper electrode of this reaction apparatus;

FIG. 5 is a partially cutaway sectional view illustrating another embodiment of the upper electrode of this reaction apparatus;

FIG. 6 is a relational chart illustrating the relationship between the transverse distance of the substrate and thickness of a thin film upon forming the thin film when a solid dielectric is arranged on each of the upper and lower electrodes;

DETAILED DESCRIPTION OF THE INVENTION

According to the present invention, there is provided an atmospheric pressure reaction method for treating the surface of a substrate with a reactive plasma which comprises introducing a reagent gas or a mixture of a reagent gas and a rare gas or an inert gas into a reaction vessel having a pair of opposing electrodes, an upper electrode of which consists of a plurality of fine wires, or the surface of an upper electrode of which is covered with a solid dielectric, exciting the gas to produce glow discharge plasma under atmospheric pressure and treating the surface of said substrate with said plasma.

The film forming apparatus preferably has an upper electrode consisting of several fine wires, a solid dielectric on the upper surface of an lower electrode on which the substrate is placed and a perforated pipe which uniformly diffuses gas over the surface of the substrate and its vicinity. This is shown in FIG. 1.

Figure 1:
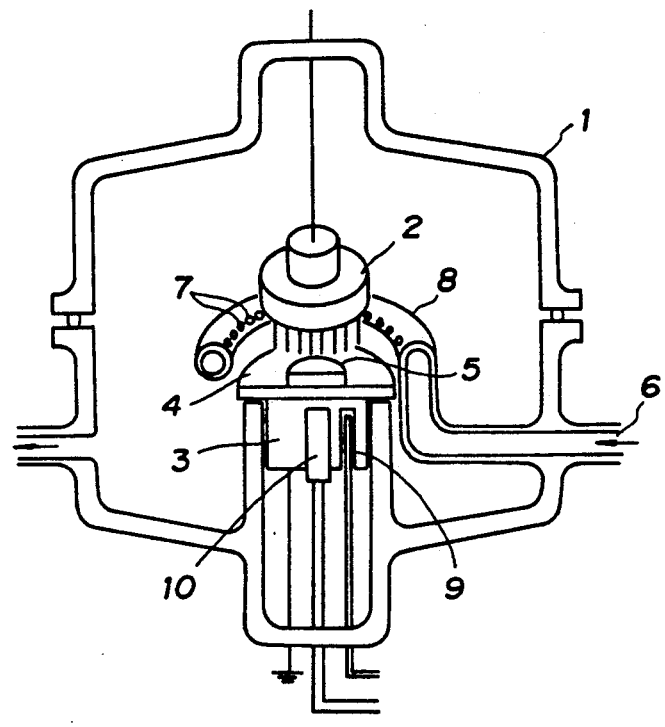
FIG. 1 is a perspective sectional view illustrating a film forming apparatus having an upper electrode comprising a plurality of fine wires, as an embodiment of the present invention.

FIG. 1 shows an example. This apparatus has an upper electrode (2) and a lower electrode (3) which apply high voltage in the reaction vessel consisting of a bell jar (1) made from Pyrex glass, for example. The upper electrode (2) consists of a plurality of fine wires. On the upper surface of the lower electrode (3), a solid dielectric (4) of such as glass, ceramics or plastics is provided. On this solid dielectric (4), a substrate (5) of plate body or the like is placed.

A mixture of inert gas such as He, Ne, Ar or $N_2$ and monomer gas such as hydrocarbon which is a raw material for forming a thin film is introduced through inlet (6) into a perforated pipe (8) having several openings (7) so that the mixture gas diffuses uniformly from openings (7) onto the substrate (5). Unreacted gas, inert gas, etc. are discharged from the gas exit of the reaction vessel.

A temperature sensor (9) and a heater (10) are provided in the lower electrode (3). A cooling device can also be installed.

In the film forming apparatus of this invention which can be indicated as an example above, the reaction zone in the bell jar (1) is maintained under the atmospheric pressure. Therefore, no vacuum device or equipment is required in a conventional low-pressure glow discharge plasma film formation apparatus.

For inert gas to be used for reaction, suitable gas such as He, Ne, Ar or $N_2$ can be used as a simple substance or mixture. However, to prevent from generating arc discharge is desirable to use He having the lowest electric potential to begin the glow discharge. It is possible to form an expected plasma polymer film by using the monomer gas to be mixed with the inert gas above-mentioned as a raw material for forming a film. The reagent gas may be selected from saturated hydrocarbons such as methane, ethane, etc., unsaturated hydrocarbons such as ethylene, propylene, etc., hydrocarbons having or not having halogen or other functional group, semimetal such as Si, Ga, etc., or gaseous metal compounds.

Depending on the gas to be used, halogen, oxygen, hydrogen, nitrogen or ammonia may be mixed for the purpose of accelerating the reaction or as a reaction component for forming a $SiN_x$ film. Mixing ratio of the inert gas and the reagent gas is not specially limited, however, the desirable gas concentration is higher than 90%. A mixture of several kinds of gas may be used.

It is desirable to produce plasma of the mixture gas at the state in which the gas is uniformly diffused and supplied in the plasma zone close to the substrate. To achieve this, the perforated pipe (8) shown in FIG. 1 or other suitable means may be used. Its shape and structure may be selected depending on the size of the apparatus and that of electrodes. In this case, inflow of outside gas (oxygen, nitrogen, etc.) must be prevented.

Plasma is formed by impressing high voltage. The voltage can be decided according to heat resistance, forming speed, or the like of the polymer film to be formed. The film formation speed can be controlled by adjusting frequency and voltage. For example, as shown in FIG. 1, it is possible to uniform the film thickness, minimize a difference in thickness between the central part and peripheral part of the substrate (5) and enable to form stable glow discharge by using fine wires for the upper electrode (2) and providing a solid dielectric (4) to the lower electrode (3). In the case of FIG. 1, a film is formed far effectively by rotating the upper electrode (1).

Usually, glow discharge is not produced easily under the atmospheric pressure, however, high stable glow discharge and plasma formation are possible by using a inert gas, the electrode consisting of several fine wires and the solid dielectric. For the substrate (5) it is possible to use a suitable material of ceramics, glass, plastics or the like.

Furthermore, this invention also offers the method and apparatus which can produce stably the atmospheric pressure glow discharge plasma reaction, without producing arc discharge, even though a conductive material such as metal or alloy is used as a substrate.

This invention further offers the atmospheric pressure plasma reaction method characterised by treating the surface of the substrate by plasma produced at the atmospheric pressure from the monomer gas introduced into the reaction vessel having dielectric-covered electrode of which the surface of the upper electrode is covered with a solid dielectric, or dielectric-covered electrodes of which the surface of each of upper and lower electrodes is covered with a solid dielectric respectively.

As a further favorate example, a perforated pipe is provided in the vicinity of the substrate so that reaction gas diffuses uniformly. This apparatus is shown in FIG. 2.

Figure 2:
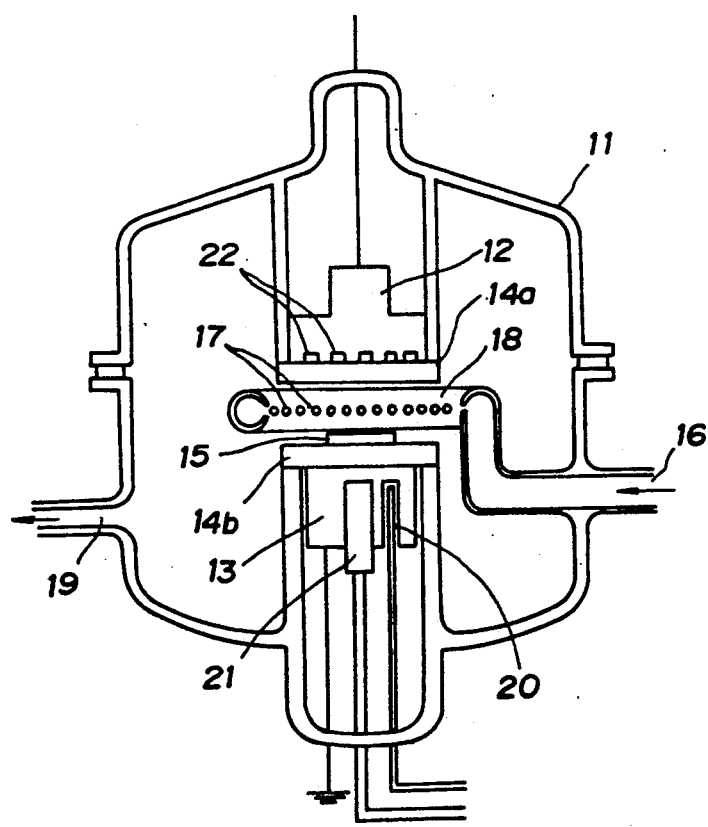
FIG. 2 is a sectional view illustrating a typical reaction apparatus of the present invention, in which a solid dielectric is arranged for each of the opposing upper and lower electrodes.

FIG. 2 shows an example of the reaction apparatus of this invention in which a solid dielectric is provided on each of upper and lower electrodes. This example has an upper electrode (12) and a lower electrode (13) to which high voltage is applied in the reaction vessel consisting of a bell jar (11) made from Pyrex glass.

On the surface of these upper electrode (12) and lower electrode (13), a heat resistant solid dielectric (14a) and (14b) made of glass, ceramics, plastics or mica are provided. On a solid dielectric (14b) provided on the upper surface of lower electrode (13), a substrate (15) such as a plate body is placed.

The reaction gas consisting of a mixture of rare gas such as He, Ne, Ar, etc., and reagent gas is introduced into a perforated pipe (18) having many openings (17) through reaction gas inlet (16) so that the reaction gas diffuses from openings (17) uniformly onto the substrate (15). Unreacted gas, rare gas, etc. are discharged from exit (19) of the reaction vessel.

A temperature sensor (20) and a heater (21) are provided in the lower electrode (13). Installation of a cooling device is possible.

In this example, the reaction zone in the bell jar (11) is maintained under the atmospheric pressure.

In general glow discharge is not produced easily at the atmospheric pressure and when the substrate (15) is metal or alloy, arc discharge occurs by applying high voltage, then the surface treatment of the substrate (15) becomes difficult. In this invention, however, stable glow discharge at the atmospheric pressure is possible by providing the solid dielectrics (14a) and (14b) on the surface of the upper electrode (12) and lower electrode (13) respectively as shown in FIG. 2, even though the substrate (15) is metal, alloy or a conductive material such as silicon. Of course, if the substrate (15) is ceramics, glass, glass plastics, or the like, high stability glow discharge can be achieved.

For reagent gas, it is possible to use an arbitrary material form among saturated or unsaturated hydrocarbons such as methane, ethane, ethylene, propylene, etc., or hydrocarbons having or not having halogenated hydrocarbon such as $CF_4$, $C_2F_6$, $CHF_3$ or $SF_6$, or other functional group, or gaseous compounds of semimetal such as Si and Ga, or metal. Furthermore, oxygen, halogen, hydrogen, nitrogen or ammonia may be added. Mixing ratio between rare gas and monomer gas is not specially limited. However, the favorate rare gas concentration is at higher than 65%, more preferably higher than 90%. For the reaction gas to be introduced, several kinds of gases may be used.

Depending on types and reaction condition of the reagent gas to be used, plasma reagent film, plasma reformed film and plasma etched film can be obtained.

As shown in FIG. 2, it is effective to form several grooves (22) on the lower surface of upper electrode (12). These grooves (22) are effective to diffuse glow discharge which is liable to concentrate into the edge and its vicinity of the upper electrode (12) and to diffuse uniformly over all the surface of the upper electrode (12). By these grooves (22), localized concentration of glow discharge is produced. Thus, a uniform film thickness is formed or uniform surface treatment is achieved on the surface of the substrate (15). The depth of these grooves (22) may be 1 to 2 mm. Furthermore, it is possible to decide the shape of these grooves (22) depending on the shape and property of the substrate (15). For example, the grooves (22) may be several holes (23) as shown in FIG. 3 or several concentric circle grooves (24) as shown in FIG. 4.

The shape of an upper electrode (12) may be changed as shown in FIG. 5. By this change, it is possible to raise the uniformity of surface treatment.

Under the atmospheric pressure, production of glow discharge have been difficult. However, high stable glow discharge and formation of its plasma become possible by using rare gas, providing solid dielectric on each of the electrodes and forming several grooves on the lower surface of the upper electrode. As a substrate (15) shown in FIG. 2 a suitable material of metal, alloy, ceramics, glass, plastics, or the like can be used.

Figure 7:
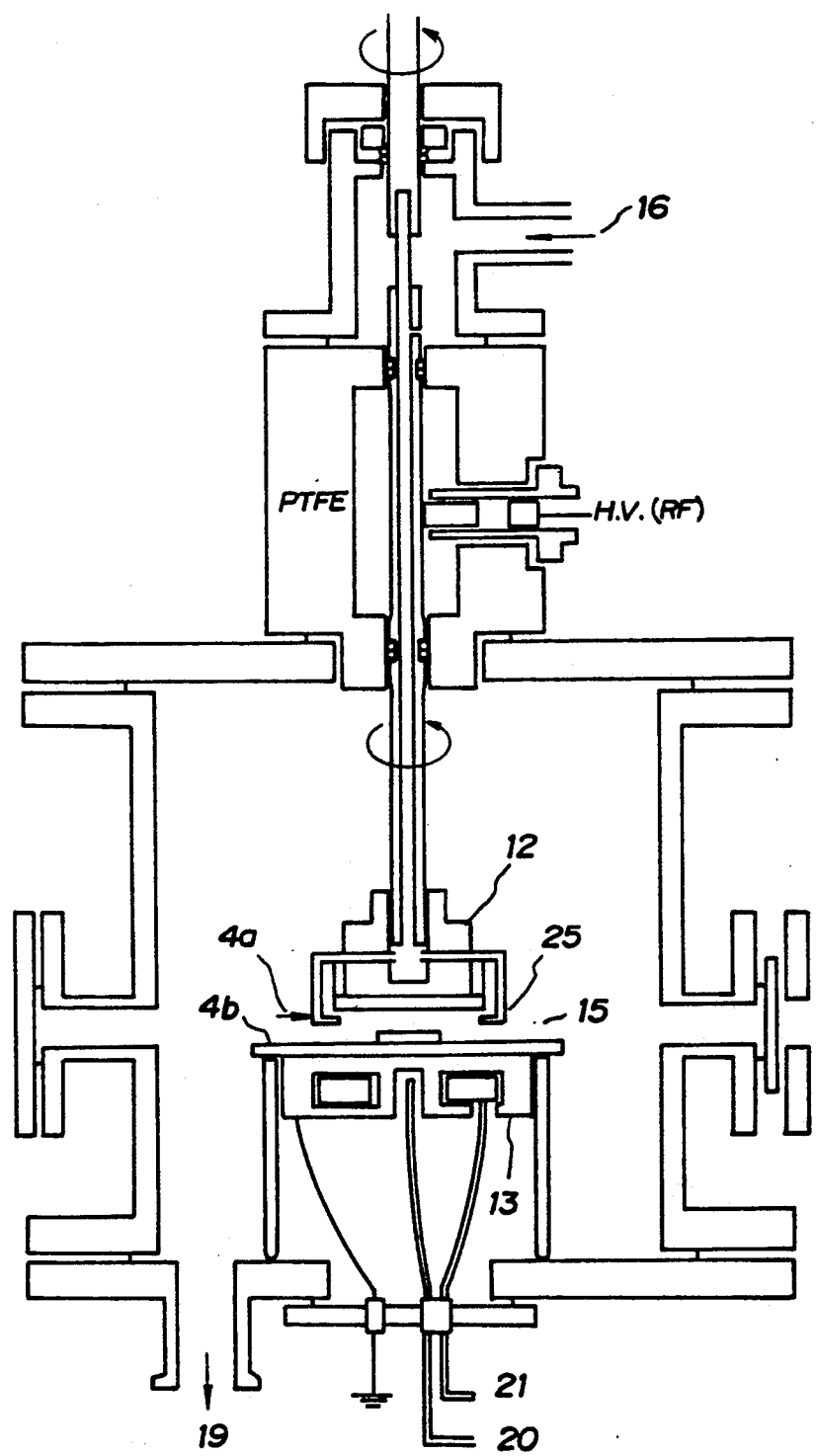
FIG. 7 is a sectional view illustrating further another embodiment of the reaction apparatus in which a solid dielectric arrange on each of the opposing upper and lower electrodes.

FIG. 7 shows and example of the reaction apparatus having a different structure from FIG. 2. The upper electrode (12) rotates and reagent gas is introduced into the reaction zone through gas nozzle (25).

Figure 10:
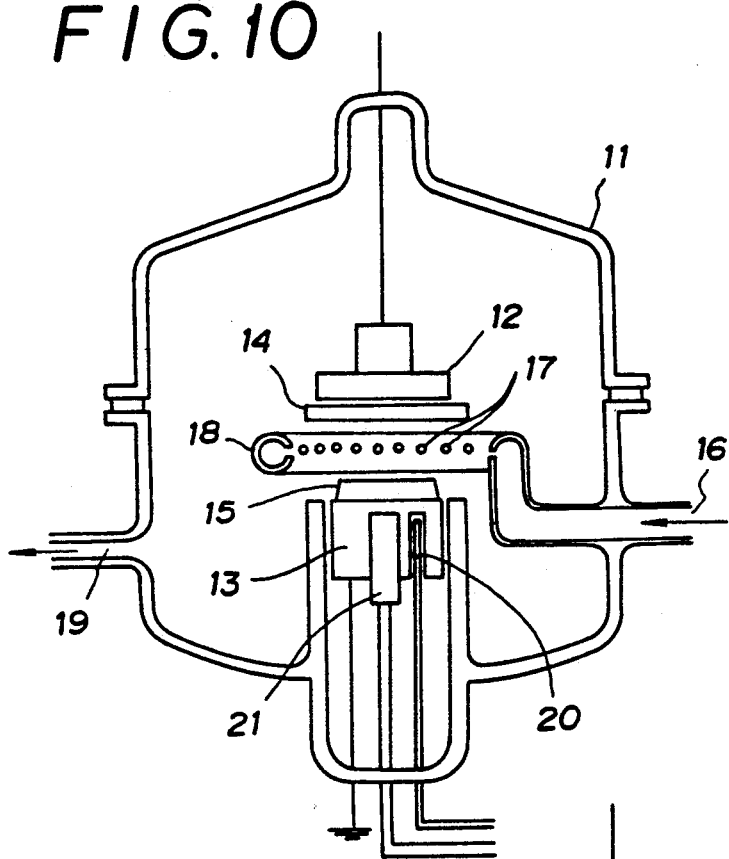
FIGS. 10 and 11 are sectional views illustrating further another embodiment of the reaction apparatus of the present invention, in which a solid dielectric is arranged on the upper electrode.

FIG. 10 shows an example in which the solid dielectric is provided only for the upper electrode. In other words, a heat resistant solid dielectric such as glass, ceramics, plastics or mica is provided on the surface of the upper electrode (12). On the upper surface of the lower electrode (13), the substrate (15) such as plate body is placed.

Figure 11:
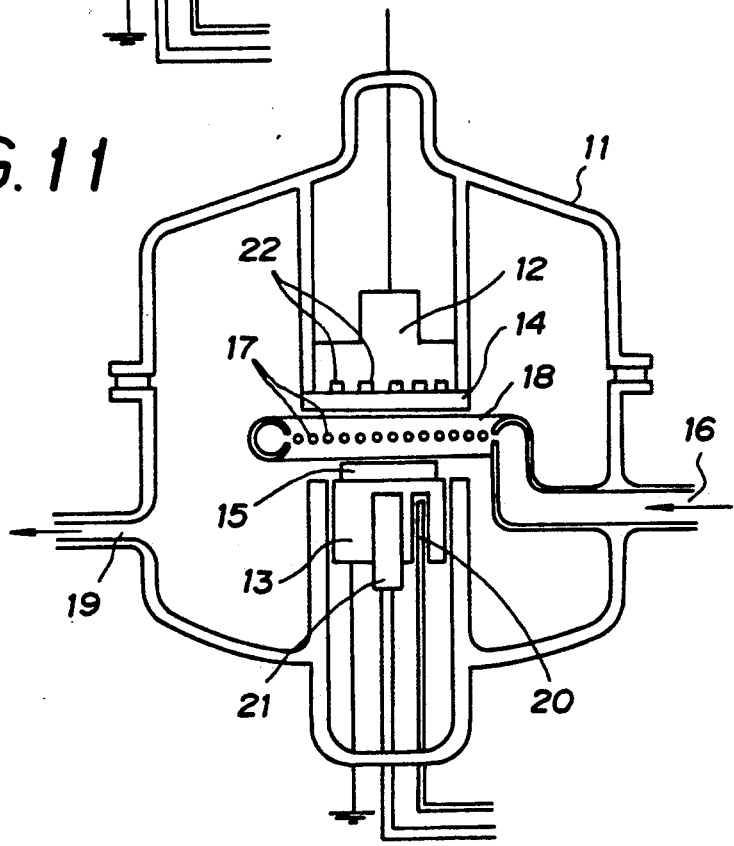

To obtain more stable plasma under the atmospheric pressure, it is effective to form several grooves (22) on the lower surface of the upper electrode (12) as shown in FIG. 11.

The grooves (22) is for uniformly diffusing glow discharge which is liable to concentrate to the edge and its vicinity of the upper electrode (12), same as FIG. 2, and cause glow discharge to diffuse over all parts of the surface of the upper electrode (12). By these grooves (22), it is possible to prevent localized concentration of glow discharge, and to produce uniformly diffused stable glow discharges, to form a uniform film thickness over the substrate (15) or to achieve a uniform surface treatment.

Now, the present invention is described further in detail by means of examples.

EXAMPLE 1

With the use of the apparatus shown in FIG. 1 (electrode diameter: 30 mm, distance between electrodes: 10 mm), a polyethylene film was formed from ethylene monomer under the following conditions:
(a) Gas mixture:
He: 4,500 SCCM,
Ethylene: 3.6 SCCM
(b) Glow discharge:
Atmospheric pressure,
3,000 Hz, 1.05 kV, 3 mA,
(c) Substrate:
Cover glass.

A polyethylene film was obtained on the substrate surface at a film forming rate of 12,500 A/2 hr. The film was transparent, with a satisfactory adhesion.

EXAMPLE 2

A polymer film of ethylene was formed in the same manner as in the Example 1 under the following conditions:
(a) Gas mixture:
He: 4,500 SCCM,
Ethylene: 6.0 SCCM
(b) Glow discharge:
Atmospheric pressure,
3,000 Hz, 1.25 kV, 6 mA,
(c) Substrate:
Cover glass.

A polyethylene film was obtained at a film forming rate of 2,100 A/2 hr. The film was transparent, with a satisfactory adhesion.

EXAMPLE 3

A polymer film of ethylene was formed in the same manner as in the Example 1 under the following conditions:
(a) Gas mixture:
He: 4,500 SCCM,
Ethylene: 2.5 SCCM
(b) Glow discharge:
Atmospheric pressure,
3,000 Hz, 1.01 kV, 2.2 mA,
(c) Substrate:
Cover glass.

A polyethylene film was obtained at a film forming rate of 16,800 A/5.5 hr. The film was transparent, with a satisfactory adhesion.

EXAMPLE 4

A polymer film of ethylene was formed in the same manner as in the Example 1 under the following conditions:
(a) Gas mixture:
He: 4,500 SCCM,
Ethylene: 3.6 SCCM
(b) Glow discharge:
Atmospheric pressure,
3,000 Hz, 1.1 kV, 3 mA,
(c) Substrate:
0.2 mm-thick quartz glass A polyethylene film was obtained at a film forming rate of 9,000 A/2 hr. The film was transparent, with a satisfactory adhesion.

EXAMPLE 5

In the apparatus as shown in FIG. 2 using heat-resistant captone-covered electrodes having a diameter of 30 mm and distance between electrodes of 10 mm (with no grooves (22)), a polyethylene film was formed from ethylene monomer under the following conditions;

(a) Reaction gas concentration (%):
Ethylene/He=95/5,
(b) Discharge:
Atmospheric pressure,
3,000 Hz, 1.05 kV, 3 mA,
(c) Substrate:
Aluminum substrate.

A polyethylene film was thus formed on the surface of the aluminum substrate at a film forming rate of 11,417 A/2 hr. The film was transparent, with an excellent adhesion and a uniform film thickness.

In this Example, highly stable glow discharge took place without the occurrence of arc discharge, thus making available high-activity and high-stability plasma.

EXAMPLE 6

In the same manner as in the Example 5, a polyethylene terephtalate film was treated under the following conditions, to make the surface thereof hydrophobic. Formation of a carbon-fluorine reformed film was confirmed.

(a) Reaction gas concentration (%):
$CF_4$/He=91.6/8.4,
$CF_4$: 20 ml/min,
He: 216.7 ml/min,
(b) Discharge
Atmospheric pressure,
3,000 Hz, 3.46 to 3.75 kV, 8 mA, The relationship between the treatment time and the contact angle is shown in Table 1. For comparison purposes, the contact angle for an untreated case is also shown in Table 1.

The surface having become hydrophobic was confirmed, with a uniform state of treatment.

TABLE 1

| Treating time | 30 sec | 1 min | 5 min | Untreated |
|---|---|---|---|---|
| Contact angle | 95.5° | 96.0° | 98.0° | 64° |

EXAMPLE 7 and 8

The same treatment as in the Example 6 was applied with a conductive graphite (already wrapped) as the substrate, under the conditions as shown in Table 2.

The measurement of the contact angle in these Examples permitted confirmation of a high degree of hydrophobic property. The result is shown in Table 2.

In an apparatus comprising electrodes not using solid dielectric, production of arc discharge made it impossible to carry out treatment.

TABLE 2

| | Example | | |
|---|---|---|---|
| Item | Example 7 | Example 8 | Case for comparison |
| Reaction gas flow rate | | | |
| $CF_4$ | 93.6 ml/min | 93.6 ml/min | — |
| He | 216.7 ml/min | 216.7 ml/min | — |
| Discharge (atmospheric pressure) | | | |
| Current | 10 mA | 3 mA | — |
| Voltage | 3.99 kV | 2.74 kV | — |
| Treating | 5 min | 20 min | — |
| Contact angle | 128° | 137° | 68° |

EXAMPLE 9 and 10

With the use of the reaction apparatus shown in FIG. 2, with grooves (22) in a case and without grooves (22) in another case, a plasma-polymerized polyethylene film was formed on a silicon substrate.

(a) Reaction gas:
$C_2H_5$: 3.6 lm/min,
He: 4,495 lm/min,
(b) Discharge:
3,000 Hz, 1.5 hr,
Atmospheric pressure, room temperature.

The relationship between the transverse distance of the silicon substrate and the thickness of the plasuma-polymerized polyethylene film is shown in FIG. 6.

As is clear from FIG. 6, as compared with the case (a) of the reaction apparatus without grooves (22), that (b) using an upper electrode with a concentric circle grooves (24) as shown in FIG. 4 permits achievement of a more uniform film thickness distribution, suggesting that plasma is stabilized for the entire surface of the substrate.

EXAMPLE 11

A $SiN_x$ film was formed with the use of the apparatus shown in FIG. 7 under the following conditions for reaction:

He: 5,000 ml/min,
$H_2$: 20 ml/min,
$N_2$: 20 ml/min,
$SiCl_4$: 4.5 mg/min,
Pressure: Atmospheric pressure,
RF: 13.56 MHz, 220 W,
Temperature: 440° C.,
Substrate: Si Wafer.

Figure 8:
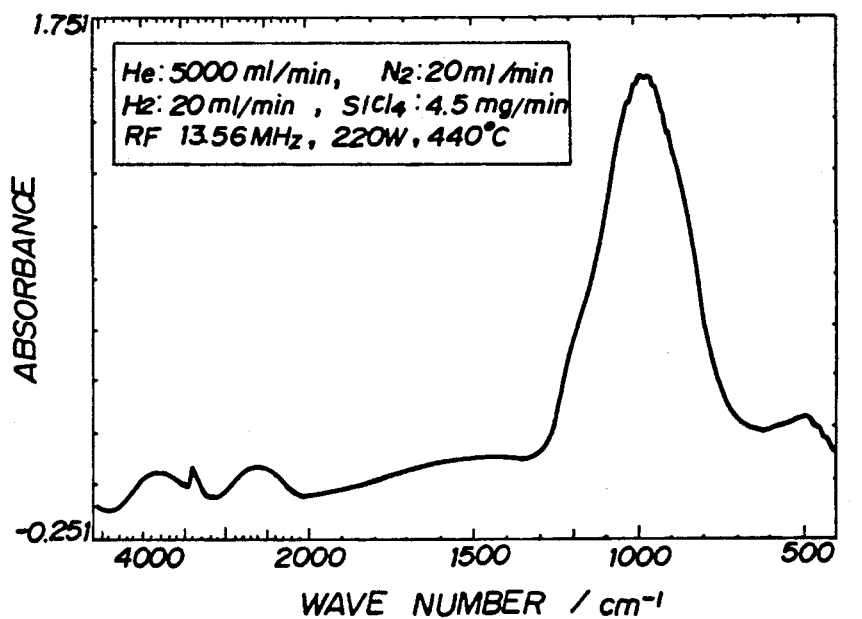
FIGS. 8 and 9 are views illustrating an IR absorption spectral chart and an XPS depth profile, respectively, when forming an $SiN_x$ film with the use of this apparatus.

FIG. 8 illustrates the difference in IR of the $SiN_x$ film thus obtained from the silicon substrate.

As Si—N expansion-contraction movement is observed near 850 cm$^{-1}$, and an Si—O expansion-contraction movement, at 1020–1090 cm$^{-1}$.

Figure 9:
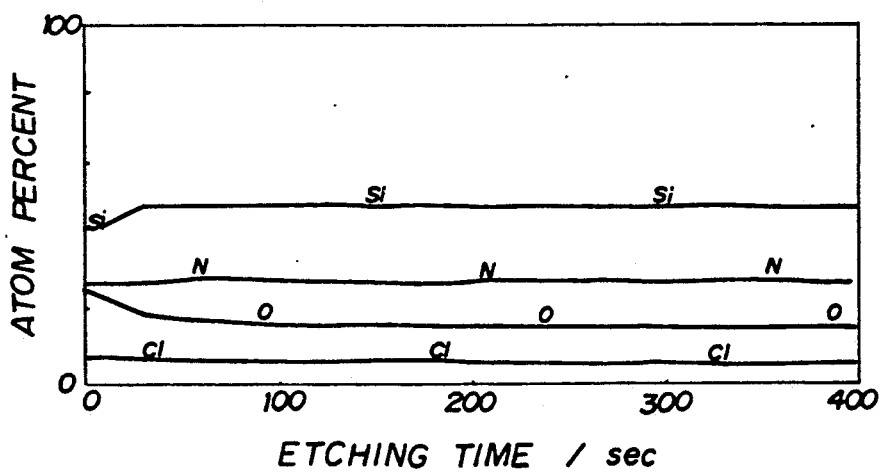

FIG. 9 shows the result of XPS analysis in the depth direction of the $SiN_x$ film, which permits confirmation of nitrogen contained in a large quantity. The film has $SiN_xO_y$ composition, and the content of oxygen thereof is controllable.

EXAMPLE 12

With the use of the apparatus shown in FIG. 10 using heat-resistant captone-covered electrodes having a diameter of 30 mm and a distance between electrodes of 10 mm, a polyethylene film was formed from ethylene monomer under the following conditions:

(a) Reaction gas flow rate:
$C_2H_4$: 3.0 SCCM,
He: 4,500 SCCM,
(b) Discharge:
Atmospheric pressure, room temperature,
3,000 Hz, 1.0 kV, 1 to 5 mA (gradually increased),
(c) Substrate:
Silicon substrate.

A polyethylene film was formed on the silicon substrate at a film forming rate of 10,000 to 20,000 A/hr. The film was transparent, with a satisfactory adhesion and a uniform film thickness.

In this example, highly stable and uniformly dispersed glow discharge took place without the occurrence of arc discharge, thus making available high-activity and high-stability plasma.

EXAMPLE 13

In the same manner as in the Example 12, a polyethylene terephthalate film was formed under the following conditions to make the surface thereof hydrophobic:
(a) Reaction gas flow rate:
$CF_4$: 25 SCCM,
He: 210 SCCM,
(b) Discharge:
Atmospheric pressure,
3,000 Hz, 3.5 kV, 2 to 8 mA (gradually increased).

The contact angle was measured five minutes after the start of treatment. The result showed a contact angle of 98.0°. A non-treated film had a contact angle of 64°. The surface having become hydrophobic was confirmed. Treatment was uniform.

EXAMPLE 14

The same treatment as in the Example 13 was applied with a conductive graphite (already wrapped) as the substrate.
(a) Reaction gas flow rate:
$CF_4$: 96 SCCM,
He: 220 SCCM,
(b) Discharge:
Atmospheric pressure,
3,000 Hz, 2.8 kV,
3 to 5 mA (gradually increased).

The contact angle was measured 15 minutes after the start of treatment. The result showed a contact angle of 131°. A non-treated film had a contact angle of 68°. The surface having become hydrophobic was confirmed. Treatment was uniform. In this Example, highly stable and uniformly dispersed glow discharge took place without the occurrence of arc discharge as in the Example 12, thus making available high-activity and high-stability plasma.

EXAMPLE 15

A $SiN_x$ film was prepared with the use of ammonia gas in place of nitrogen gas. The reaction conditions were as follows:
He: 5,000 ml/min,
$SiCl_4$: 1.6 ml/min,
$NH_3$: 15 ml/min,
Pressure: atmospheric pressure,
RF: 13.56 MHz, 118 w,
Substrate temperature: 400° C.

It was confirmed, from FT-IR spectral analysis, that a $SiN_x$ film comprising a composition incorporating $SiH_x$ and NH in plasma was formed. This film was similar to that formed by the low-pressure plasma method. Measurement of the atomic content through ESCA depth direction analysis permitted confirmation that the N atomic concentration increased from that in the film formation with $N_2$, and the Cl atomic concentration decreased. It was a $SiN_x$ film having a satisfactory film quality.

EXAMPLE 16

A $SiN_x$ film was prepared with the use of ammonia gas in the same manner as in the Example 15 except for a substrate temperature reduced to 200° C. The reaction conditions were as follows:
HE: 5,000 ml/min,
$SiCl_4$: 1.6 ml/min,
$NH_3$: 15 ml/min,
Pressure: atmospheric pressure,
RF: 13.56 MHz, 118 w,
Substrate temperature: 200° C.

It was confirmed from FT-IR spectral analysis, that a $SiN_x$ film comprising a composition incorporating $SiH_x$ and NH in plasma was formed. This film was similar to that formed by the low-pressure plasma method, and was a $SiN_x$ film consisting of a composition similar to that in the Example 15 in which the film was formed at a temperature of 400° C. Measurement of the atomic content through ESCA depth direction analysis permitted confirmation that the N atomic concentration increased from that in the film formation with $N_2$, and the Cl atomic concentration increased, as in the Example 15. It was a $SiN_x$ film having a satisfactory film quality.

The present invention is not limited to the above-mentioned examples. It is needless to mention that various manners are possible within the framework of the present invention in such details as the size and shape of the reaction vessel, the structure, configuration and shape of the electrodes, the shape and number of grooves on the lower surface of the upper electrode, and the structure and configuration of the reaction gas supply.

According to the present invention, as described above in detail, it is possible, as compared with the conventional low-pressure glow discharge plasma reaction, to eliminate the necessity of an apparatus and facilities for forming a vacuum system, reduce the cost, and carry out film formation and/or surface treatment under the atmospheric pressures, requiring only simple structure and configuration of the apparatus and permitting easy treatment of a large-area substrate because the substrate can be set directly on the upper surface of the lower electrode.

Furthermore, the present invention allows film formation and/or surface treatment without limiting the material, shape and properties of the substrate and makes available uniform film thickness and surface condition of the thin film obtained.

What is claimed is:
1. A method of forming a thin polymeric film on a substrate which comprises introducing a mixture of an organic monomer gas and helium into a reaction vessel having an upper and lower pair of opposing electrodes, wherein the upper electrode comprises a plurality of fine wires, exciting the gas to produce a glow discharge plasma at atmospheric pressure and depositing the plasma on a substrate, and wherein the helium in the gaseous mixture is present in an amount higher than 90% by volume.

* * * * *